United States Patent
Cho

(10) Patent No.: US 7,358,659 B2
(45) Date of Patent: Apr. 15, 2008

(54) MONOLITHIC WHITE LIGHT EMITTING DEVICE HAVING NITRIDE CLADDING LAYERS AND PASSIVE LAYER

(75) Inventor: Jae-hee Cho, Gyeonggi-do (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 248 days.

(21) Appl. No.: 11/081,638

(22) Filed: Mar. 17, 2005

(65) Prior Publication Data

US 2005/0206312 A1    Sep. 22, 2005

(30) Foreign Application Priority Data

Mar. 18, 2004  (KR) .................. 10-2004-0018281

(51) Int. Cl.
    *H01J 1/62*     (2006.01)
    *H05B 33/00*    (2006.01)
(52) U.S. Cl. .................. 313/498; 313/501; 257/13
(58) Field of Classification Search ........ 313/498–512; 257/13, 79
    See application file for complete search history.

(56) References Cited

U.S. PATENT DOCUMENTS 6,277,664 B1    8/2001    Lozykowski et al.

2004/0072383 A1*   4/2004   Nagahama et al. ........... 438/47
2004/0106222 A1*   6/2004   Steckl et al. ................. 438/22
2004/0232433 A1*  11/2004   Doverspike et al. .......... 257/97

FOREIGN PATENT DOCUMENTS

JP    2000-286445 A    10/2000

OTHER PUBLICATIONS

Motokazu Yamada et al., "Phosphor Free High-Luminous-Efficiency White Light-Emitting Diodes Composed of InGaN Multi-Quantum Well", Part 2, No. 3A, Mar. 1, 2002, pp. L246-L248, J. Appl. Phys. vol. 41 (2002), The Japan Society of Applied Physics, Tokushima, Japan.
Office Action dated Apr. 19, 2007 in corresponding Korean Patent Application.

* cited by examiner

*Primary Examiner*—Joseph Williams
*Assistant Examiner*—Bumsuk Won
(74) *Attorney, Agent, or Firm*—Buchanan Ingersoll & Rooney PC

(57) ABSTRACT

A monolithic white light emitting device is provided, including an active layer and a passive layer that emits light with a long wavelength obtained by wavelength conversion. White light can be obtained by appropriately controlling lights emitted from the active layer and the passive layer. The monolithic white light emitting device is easily manufactured at a low cost and applied to a wide range of fields compared with a conventional white light emitting device that needs a help of a phosphor.

20 Claims, 2 Drawing Sheets

MONOLITHIC WHITE LIGHT EMITTING DEVICE HAVING NITRIDE CLADDING LAYERS AND PASSIVE LAYER

Priority is claimed to Korean Patent Application No. 10-2004-0018281, filed on Mar. 18, 2004, in the Korean Intellectual Property Office, the disclosure of which is incorporated herein in its entirety by reference.

BACKGROUND OF THE INVENTION

1. Field of the Invention

The present invention relates to a white light emitting device, and more particularly, to a monolithic white light emitting device capable of spontaneous white light emission.

2. Description of the Related Art

Generally, white light emitting devices generate white light using light emission by a semiconductor and light emission by a phosphor (see U.S. Pat. Nos. 6,069,440 and 5,998,925). These light emitting devices absorb light emitted by the semiconductor using the phosphor, so emits light close to white. The semiconductor usually emits blue light, and the phosphor absorbs the blue light emitted by the semiconductor to generate green/red light. Hence, the phosphor is a mixture of green and red fluorescent materials.

According to a hybrid white light emitting device having such a structure, it is not easy to implement an integrated circuit manufactured according to an existing semiconductor manufacturing process. Thus, the fields to which the hybrid white light emitting device are applied is restricted.

T. Mukai has proposed a white light emitting device (LED) having no phosphors and using multi-band emission (see JJAP 41 (3A) L246 2002). Accordingly, Mukai's LED has a plurality of active layers to generate light of different wavelengths.

This LED, which is usually used in a backlight device, needs to be easily manufactured and to have high light-emission efficiency and whiteness.

SUMMARY OF THE INVENTION

The present invention provides a monolithic white light emitting device which can have a new and simple structure that can be easily manufactured.

According to an aspect of the present invention, there is provided a white light emitting device including: an active light-emission portion including an n-type nitride cladding layer, a p-type nitride cladding layer, and an active layer formed between the n-type and p-type nitride cladding layers; a passive layer having a doping level due to atoms with which a nitride semiconductor is doped, absorbing light emitted from the active light-emission portion and generating light with a wavelength longer than a wavelength of the light emitted from the active light-emission portion; and an insulative substrate supporting the active light-emission portion and the passive layer.

The nitride cladding layer may be GaN. The active layer may include a GaN barrier layer and an InGaN well layer. The atoms with which the passive layer is doped may be either rare earth metal or silicon.

The n-type cladding layer may be GaN doped with Si, and the p-type cladding layer may be GaN doped with Mg.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

An exemplary monolithic white light emitting device according to the present invention will now be described in detail with reference to the accompanying drawings, in which exemplary embodiments are shown.

Figure 1:
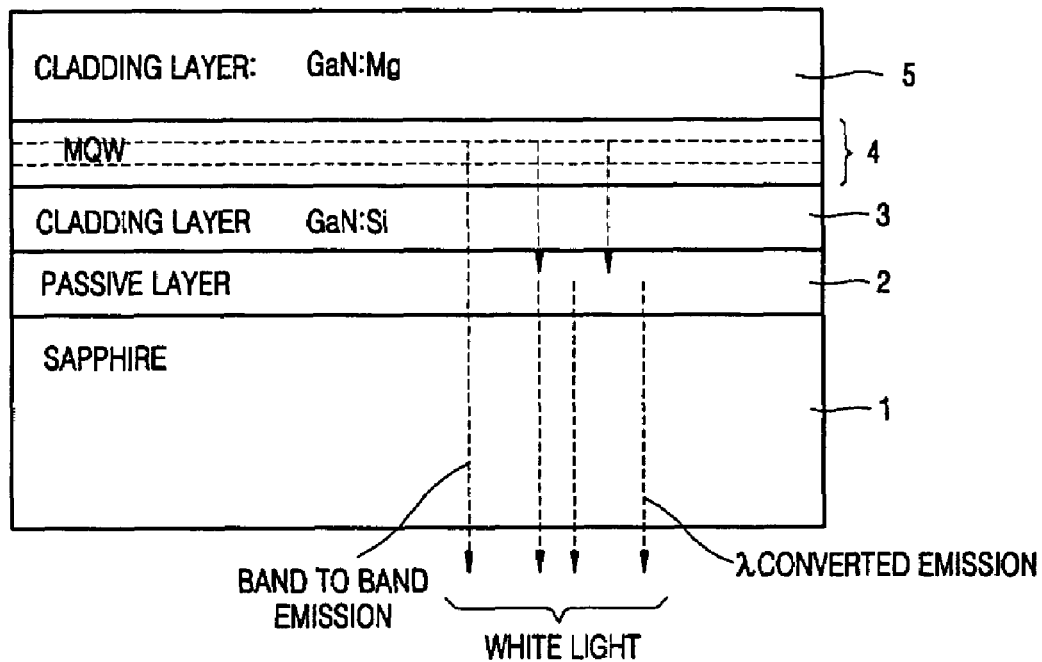
FIG. 1 is a schematic cross-sectional view of a vertical structure of a light emitting device according to an embodiment of the present invention.
Figure 2:
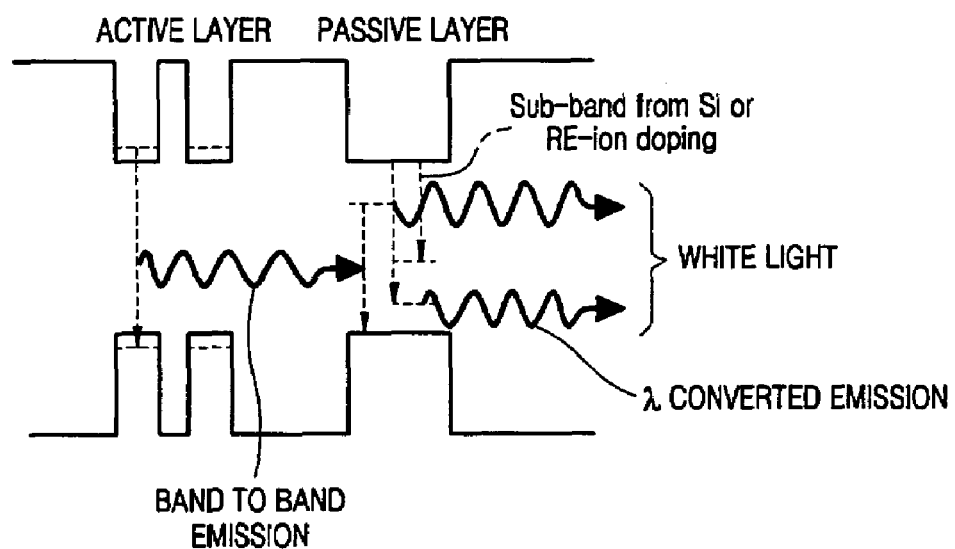
FIG. 2 is an energy distribution diagram explaining a light-emission mechanism of the light emitting device of FIG. 1.

FIG. 1 is a schematic cross-sectional view of a vertical structure of a light emitting device according to an embodiment of the present invention. FIG. 2 is an energy distribution diagram explaining a light-emission mechanism of the light emitting device of FIG. 1.

Referring to FIG. 1, first, a passive layer is formed as a wavelength conversion layer on an insulative substrate 1, which is formed of sapphire, for example. An n-cladding layer (n-GaN) 3, doped with Si, is formed as an n-type semiconductor layer on the passive layer 2. A multi-quantum well (MQW) active layer 4 is formed on the n-cladding layer 3. A p-cladding layer (p-GaN) 5, doped with Mg, is formed as a p-type semiconductor layer on the MQW active layer 4. A well layer in the MQW active layer 4 is formed of InGaN, and a barrier layer therein includes AlGaInN. Theses layers are stacked, for example, for about 5 periods, to form the MQW active layer 4.

According to an aspect of the present invention, a semiconductor material layer doped with impurities, such as, silicon or rare earth metal, that is, the passive layer 2, is formed below the n-cladding layer 3. In the exemplary embodiment, the passive layer 2 is either AlGaN or GaN, preferably, AlGaN. The impurities with which the passive layer 2 are either Si or rare earth (RE) metal of a $10^{19}/cm^2$ concentration and a 1-200 μm thickness, for instance.

Hence, as illustrated in FIGS. 1 and 2, the MQW active layer 4 emits light with a short wavelength due to band-to-band emission based on a quantum level. The light with the short wavelength excites the passive layer formed thereunder, and the excited passive layer emits light with a long wavelength. In other words, the passive layer serves as a wavelength conversion layer, so the long wavelength light together with the short wavelength light emitted from the active layer 4 form white light. This white light emission due to light absorption by the passive layer 2 is achieved not by natural defects but by impurity defects due to an implantation of silicon or rare earth metal ions (RE-ion). Eu, Sm, Pr, or the like may be used as the RE metal for a wavelength of 580 to 630 nm. Er, Ho, Tb, or the like may be used as the RE metal for a wavelength of 430 to 480 nm. Si may be used as the RE metal for a wavelength of 540 to 590 nm.

Hence, the passive layer 2 can emit white light together with the light emitted from the active layer 4, by being doped with RE metal, Si, or the like either singly or at an appropriate ratio.

Figure 3:
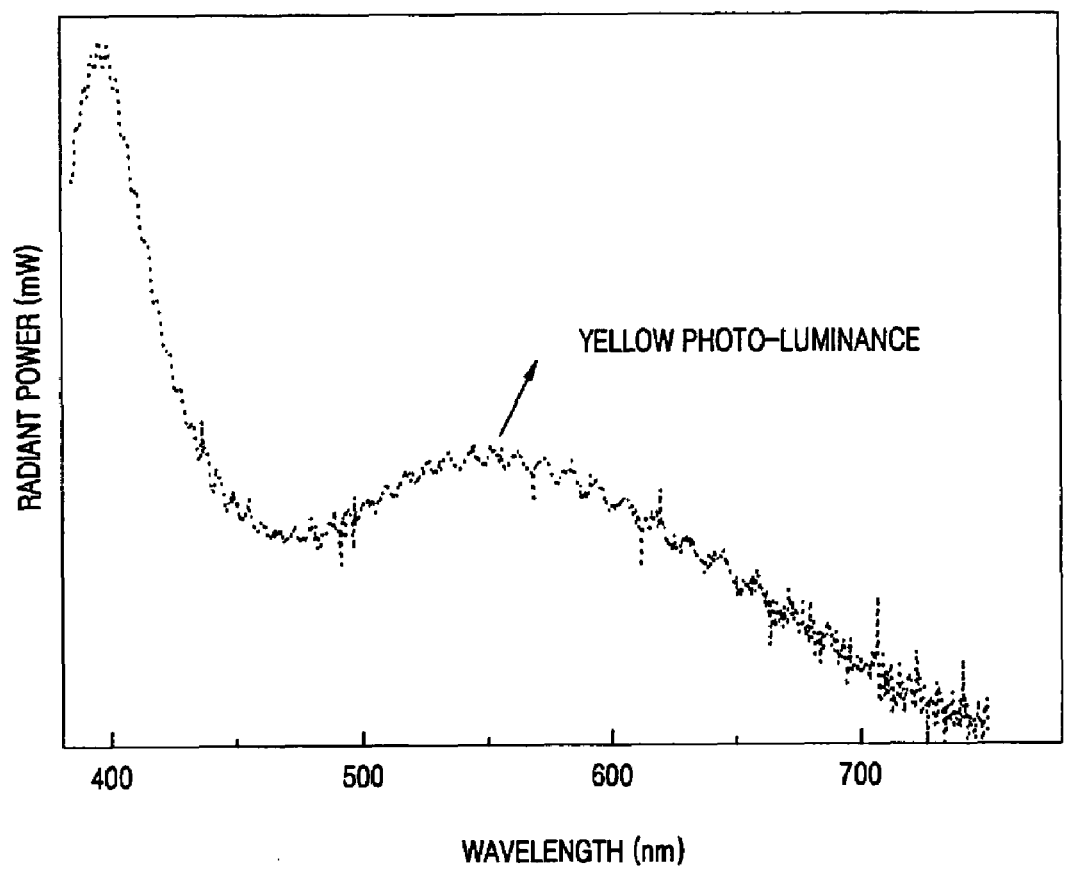
FIG. 3 is a graph showing a measured photo-luminance (PL) spectrum to examine a performance of a light emitting device according to the present invention.

FIG. 3 is a graph showing a measured photo-luminance (PL) spectrum of a sample to examine light emission characteristics of a light emitting device according to the present invention. FIG. 3 shows a measured PL spectrum of a sample in which a GaN barrier of an MQW active layer is doped with Si at 775° C. using a silane gas of 0.35 sccm. The MQW active layer is formed by stacking InGaN/GaN for 5 periods. In this sample, the MQW active layer includes a passive layer by being doped with Si, so it can be ascertained whether light emission occurs in a PL wavelength band of 450 to 700 nm. Referring to FIG. 3, light emission occurs in the active layer itself.

As described above, an embodiment of the present invention provides a monolithic white light emitting device in which white light emission occurs in a semiconductor layer. This monolithic white light emitting device can emit white light without any help of a phosphor that is needed in a conventional white light emitting device, so a manufacture of the monolithic white light emitting device becomes easier. Particularly, since the monolithic white light emitting device has a monolithic structure, it can be applied to a wide range of fields, and its manufacturing costs are low.

The exemplary embodiment of the present invention proposes a structure of a white light emitting device that includes a separate passive layer doped with impurities in addition to an active layer of a nitride semiconductor so that light emission is induced from a sub-band of the passive layer. Thus, the white light emitting device having this structure can be used as a white light source in various fields.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white light emitting device comprising:
   an active light-emission portion including an n-type nitride cladding layer, a p-type nitride cladding layer, and an active layer formed between the n-type and p-type nitride cladding layers;
   a passive layer having a doping level due to atoms with which a nitride semiconductor is doped to absorb light emitted from the active light-emission portion and generate light with a wavelength longer than a wavelength of the light emitted from the active light-emission portion; and
   an insulative substrate supporting the active light-emission portion and the passive layer.

2. The white light emitting device of claim 1, wherein the nitride cladding layer is GaN.

3. The white light emitting device of claim 1, wherein the active layer includes a GaN barrier layer and an InGaN well layer.

4. The white light emitting device of claim 3, wherein the atoms with which the passive layer is doped are rare earth metal.

5. The white light emitting device of claim 3, wherein the atoms with which the passive layer is doped are silicon of an excess amount greater than $10^{19}/cm^3$.

6. The white light emitting device of claim 1, wherein the n-type cladding layer is GaN doped with Si, and the p-type cladding layer is GaN doped with Mg.

7. The white light emitting device of claim 1, wherein a thickness of the passive layer is 1 to 200 μm.

8. The white light emitting device of claim 1, wherein the passive layer is formed from one of GaN or AlGaN.

9. The white light emitting device of claim 8, wherein the passive layer is doped with any combination of Si and one or more rare earth metals.

10. The white light emitting device of claim 9 wherein the rare earth metals include Eu, Sm, Pr, Er, Ho and Tb.

11. The white light emitting device of claim 1, wherein the active layer includes a multi-quantum well (MQW) active layer, and wherein the MQW active layer includes a barrier layer that includes AlGAInN.

12. A light emitting device, comprising:
   an transparent insulative substrate;
   a wavelength conversion layer formed above the insulative substrate;
   a first cladding layer formed above the wavelength conversion layer, the first cladding layer being doped with a first dopant type;
   a multi-quantum well (MQW) active layer formed above the first cladding layer structured to emit light with short wavelengths; and
   a second cladding layer formed above the MQW active layer, the second cladding layer being doped with a second dopant type that is opposite the first dopant type,
   wherein the conversion layer is structured to convert a portion of the light with the short wavelengths emitted from the MQW active layer into light with long wavelengths and to allow remainder of the light with short wavelengths to pass through such that white light is emitted from the light emitting device.

13. The light emitting device of claim 12,
   wherein first cladding layer is an n-type cladding layer formed of GaN with Si doping,
   wherein the second cladding layer is a p-type cladding layer formed of GaN with Mg doping, and
   wherein the wavelength conversion layer is formed from one of GaN or AlGaN with doping of any combination of Si and one or more rare earth metals.

14. The light emitting device of claim 13, wherein the rare earth metals include Eu, Sm, Pr, Er, Ho and Tb.

15. The light emitting device of claim 13, wherein the MOW active layer includes a well layer formed of InGaN and a barrier layer formed of AlGAInN.

16. The light emitting device of claim 12, wherein the transparent insulative substrate is formed of sapphire.

17. A method of forming a light emitting device, comprising:
   forming a transparent insulative substrate;
   forming a wavelength conversion layer above the insulative substrate and doping the wavelength conversion layer with any combination of Si and one or more rare earth metals;
   forming an n-type cladding layer above the conversion layer;
   forming a multi-quantum well (MQW) active layer above the n-type cladding layer and structuring the MQW active layer to emit light with short wavelengths; and
   forming a p-type cladding layer above the MQW active layer, wherein the step of forming the wavelength conversion layer includes structuring the conversion layer to convert a portion of the light with the short wavelengths emitted from the MQW active layer into light with long wavelengths and to allow remainder of the light with short wavelengths to pass through such that white light is emitted from the light emitting device.

18. The method of claim 17, wherein the step of forming the n-type cladding layer includes forming the n-type cladding layer from GaN and doping the n-type cladding layer with Si, wherein the step of forming the p-type cladding layer includes forming the p-type cladding layer from GaN and doping the p-type cladding layer with Mg, and wherein the step of forming the MQW active layer includes forming a well layer from InGaN and forming a barrier layer from AlGAInN.

19. The method of claim 17, wherein the rare earth metals include Eu, Sm, Pr, Er, Ho and Tb.

20. The method of claim 17, wherein the step of forming the transparent insulative substrate includes forming the transparent insulative substrate from sapphire.

* * * * *